(12) United States Patent  
Strauss et al.

(10) Patent No.: US 9,356,423 B2  
(45) Date of Patent: *May 31, 2016

(54) LASER DIODE ASSEMBLY

(71) Applicant: OSRAM Opto Semiconductors GmbH, Regensburg (DE)

(72) Inventors: Uwe Strauss, Bad Abbach (DE); Soenke Tautz, Tegernheim (DE); Alfred Lell, Maxhuette-Haidhof (DE); Karsten Auen, Regensburg (DE); Clemens Vierheilig, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/496,975

(22) Filed: Sep. 25, 2014

(65) Prior Publication Data

US 2015/0288138 A1 Oct. 8, 2015

Related U.S. Application Data

(63) Continuation of application No. 13/857,100, filed on Apr. 4, 2013, now Pat. No. 8,867,582.

(60) Provisional application No. 61/620,359, filed on Apr. 4, 2012.

(30) Foreign Application Priority Data

Mar. 19, 2012 (DE) .......................... 10 2012 102 306

(51) Int. Cl.
*H01S 5/022* (2006.01)
*H01S 5/024* (2006.01)

(Continued)

(52) U.S. Cl.
CPC ............. *H01S 5/02272* (2013.01); *H01S 5/022* (2013.01); *H01S 5/02212* (2013.01);
(Continued)

(58) Field of Classification Search
CPC ............. H01S 3/00; H01S 3/02; H01S 3/025; H01S 3/04; H01S 3/0405
USPC .......................................... 372/33, 36, 43.01
See application file for complete search history.

(56) References Cited

U.S. PATENT DOCUMENTS 3,136,932 A 6/1964 Trent
5,018,820 A 5/1991 Boudreau et al.
(Continued)

FOREIGN PATENT DOCUMENTS

CN 1093837 A 10/1994
CN 1816952 A 8/2006
(Continued)

OTHER PUBLICATIONS

Carcia, P.F., et al., "Gas diffusion ultrabarriers on polymer substrates using Al2O3 atomic layer deposition and SiN plasma-enhanced chemical vapor deposition," Journal of Applied Physics, No. 106, 2009, 6 pages.

(Continued)

*Primary Examiner* — Dung Nguyen
(74) *Attorney, Agent, or Firm* — Slater Matsil, LLP

(57) ABSTRACT

A laser diode assembly includes a housing having a housing part and a mounting part that is connected to the housing part and that extends away from the housing part along an extension direction. A laser diode chip is disposed on the mounting part. The laser diode chip has, on a substrate, semiconductor layers with an active layer for emitting light. The housing part and the mounting part have a main body composed of copper and at least the housing part is steel-sheathed. A first solder layer having a thickness of greater than or equal to 3 μm is arranged between the laser diode chip and the mounting part.

16 Claims, 9 Drawing Sheets

(51) Int. Cl.
*H01S 5/323* (2006.01)
*H01S 5/028* (2006.01)

(52) U.S. Cl.
CPC ......... *H01S5/02469* (2013.01); *H01S 5/02476* (2013.01); *H01S 5/32341* (2013.01); *H01S 5/0282* (2013.01); *H01S 2301/176* (2013.01)

(56) References Cited

U.S. PATENT DOCUMENTS

| | | | |
|---|---|---|---|
| 5,198,686 | A | 3/1993 | Yoshimura |
| 5,319,655 | A | 6/1994 | Thornton |
| 5,557,116 | A | 9/1996 | Masui et al. |
| 6,044,101 | A | 3/2000 | Luft |
| 6,323,059 | B1 | 11/2001 | Yoshida et al. |
| 6,335,548 | B1 | 1/2002 | Roberts et al. |
| 6,347,107 | B1 | 2/2002 | Roddy et al. |
| 6,590,920 | B1 | 7/2003 | McElhinney et al. |
| 8,432,948 | B2 | 4/2013 | Tohyama et al. |
| 8,737,445 | B2* | 5/2014 | Lell et al. ............... 372/50.1 |
| 2002/0171135 | A1 | 11/2002 | Yoshida et al. |
| 2003/0067950 | A1 | 4/2003 | Hanaoka |
| 2004/0196877 | A1 | 10/2004 | Kawakami et al. |
| 2005/0074046 | A1* | 4/2005 | Kasai ................ H01S 5/02212 372/50.1 |
| 2007/0051968 | A1 | 3/2007 | Yamamoto et al. |
| 2007/0215996 | A1 | 9/2007 | Otremba |
| 2008/0130698 | A1 | 6/2008 | Bessho et al. |
| 2008/0237569 | A1* | 10/2008 | Nago ................ H01L 33/32 257/13 |
| 2008/0267238 | A1 | 10/2008 | Takeuchi et al. |
| 2008/0317080 | A1 | 12/2008 | Kameyama et al. |
| 2009/0010293 | A1* | 1/2009 | Kamikawa ......... H01S 5/32341 372/46.01 |
| 2010/0124246 | A1 | 5/2010 | Lutgen et al. |
| 2010/0303110 | A1 | 12/2010 | Bhagavatula et al. |
| 2011/0057220 | A1 | 3/2011 | Mochida et al. |
| 2011/0134948 | A1 | 6/2011 | Kawakami et al. |
| 2012/0033698 | A1 | 2/2012 | Morizumi |
| 2012/0057612 | A1 | 3/2012 | Yoshida et al. |
| 2012/0326178 | A1 | 12/2012 | Fehrer et al. |
| 2013/0143338 | A1 | 6/2013 | Stephens, IV et al. |
| 2013/0272333 | A1 | 10/2013 | Strauss et al. |
| 2013/0343419 | A1 | 12/2013 | Lell et al. |
| 2014/0362883 | A1 | 12/2014 | Lell et al. |

FOREIGN PATENT DOCUMENTS

| | | |
|---|---|---|
| CN | 101202421 A | 6/2008 |
| CN | 201303205 Y | 9/2009 |
| CN | 102214894 A | 10/2011 |
| DE | 1184870 | 1/1965 |
| DE | 102004052686 A1 | 3/2006 |
| DE | 102005041064 A1 | 3/2007 |
| DE | 102005053274 A1 | 4/2007 |
| DE | 102005058237 A1 | 4/2007 |
| DE | 102006017294 A1 | 7/2007 |
| JP | 4137521 A | 5/1992 |
| JP | 04137521 A * | 5/1992 |
| JP | 2560131 B2 | 12/1996 |
| JP | 2001127382 A | 5/2001 |
| JP | 2001135745 A | 5/2001 |
| JP | 2003101113 A | 4/2003 |
| JP | 2003198038 A | 7/2003 |
| JP | 2004006824 A | 1/2004 |
| JP | 2005019973 A | 1/2005 |
| JP | 2005101073 A | 4/2005 |
| JP | 2006135219 A | 5/2006 |
| JP | 200821909 A | 1/2008 |
| JP | 2008160070 A | 7/2008 |
| JP | 2008532279 A | 8/2008 |
| JP | 201056434 A | 3/2010 |
| JP | 2011151080 A | 8/2011 |
| JP | 2011222627 A | 11/2011 |
| TW | 451535 B | 8/2001 |
| TW | 201221337 A | 6/2012 |
| WO | 2005002012 A1 | 1/2005 |
| WO | 2006090990 A1 | 8/2006 |
| WO | 2011073027 A1 | 6/2011 |

OTHER PUBLICATIONS

Eichler, C., "Thermisches Management GaN-basierter Laserdioden," Cuvillier Verlag Göttingen, 2006, ISBN 3-86537-754-8, pp. 132-133 and 136-137.

Hirvikorpia, T., et al., "Enhanced water vapor barrier properties for biopolymer films by polyelectrolyte mulitlayer and atomic layer deposited Al2O3 double-coating," Applied Surface Science, vol. 257, 2011, pp. 9451-9454.

Johansson, P., "Atomic Layer Deposition Process for Barrier Applications of Flexible Packaging," downloaded from http://www.tappi.org/content/events/10PLACE/pagpes/johansson.pdf, Apr. 18-21, 2010, 21 pages.

Lutgen, S., et al., "Recent results of blue and green InGaN laser diodes for laser projection," Proc. SPIE, vol. 7953, 2011, pp. 79530G1-79530G12.

Ritala, M., et al., "Atomic layer deposition," Handbook of Thin Film Materials, vol. 1: Deposition and Processing of Thin Films, Academic Press, 2002, ISBN 0-12-512909-2/535.00, pp. 103-159.

Sizov, D., et al., •Gallium Indium Nitride-Based Green Lasers,• IEEE Journal of Lightwave Technology, vol. 30, No. 5, Mar. 1, 2012, pp. 679-699.

Sizov, D., et al., "Carrier Transport in InGaN MQWs of Aquamarine- and Green-Laser Diodes," IEEE Journal of Selected Topics in Quantum Electronics, vol. 17, No. 5, Sep./Oct. 2011, pp. 1390-1401.

Strauss, U., et al., "Pros and cons of green InGaN laser on c-plane GaN," Phys. Status Solidi B, vol. 248, 2010, pp. 652-657.

Vierheilig, C., et al., "Beyond blue pico laser: development of high power blue and low power direct green," Proc. SPIE, vol. 8277, Novel In-Plane Semiconductor Lasers XI, Feb. 9, 2012, pp. 82770K-1-82770K-7.

* cited by examiner

LASER DIODE ASSEMBLY

This is a continuation application of U.S. application Ser. No. 13/857,100, entitled "Laser Diode Assembly," which was filed on Apr. 4, 2013 and claims the benefit of U.S. Provisional Application No. 61/620,359, filed on Apr. 4, 2012. This application is related to German Patent Application No. 10 2012 102 306.9 filed on Mar. 19, 2012. All applications are incorporated herein by reference.

TECHNICAL FIELD

A laser diode assembly is specified.

BACKGROUND

Light sources having a high optical power density are key components for a multiplicity of applications. By way of example, laser diodes composed of a nitride-based compound semiconductor material system have a high market potential for projection systems, in particular those having luminous fluxes of between 1,000 and 10,000 lumens.

Therefore, components having high output power and compact housings are required for such applications. For cost reasons and in the context of standardization, housings of the so-called TO type series (TO: "transistor outline") in the form of TO metal housings ("TO metal can") are customary, for instance, in the form of the known structural sizes TO38, TO56 and TO90, wherein the TO metal housings are substantially manufactured from steel. However, currently available laser diodes in such standard TO designs, also designated hereinafter as "TO housings" for short, have been limited heretofore to optical powers of less than 3 watts, which is insufficient for many applications. To date, however, it has not yet been possible to achieve optical powers of more than 3 watts with such designs.

By way of example, the document C. Vierheilig, et al., Proc. SPIE, vol. 8277, 82770K, 2012, discloses blue-emitting nitride-based laser diodes in TO housings which, at room temperature in continuous wave operation, can emit light having a wavelength in the range of 440 nm to 460 nm with an output power of a maximum of 2.5 watts.

SUMMARY OF THE INVENTION

Embodiments of the present invention specify a laser diode assembly.

In accordance with at least one embodiment, a laser diode assembly comprises a housing, in which a laser diode chip is arranged. The housing has, in particular, a housing part and a mounting part, which is connected to the housing part and which extends away from the housing part along an extension direction. In other words, the mounting part projects away from the housing part and can be embodied in a pin-type fashion, for example. The mounting part has a mounting area, which extends away from the housing part along the extension direction of the mounting part and on which the laser diode chip is arranged. The housing part can be provided and designed, in particular, for making it possible to arrange a housing cover for closing the housing on the housing part.

The housing part and the mounting part, which can, in particular, also be embodied integrally with one another, each have a main body composed of copper or else, in the case of an integral embodiment, a common main body composed of copper. At least the housing part is furthermore steel-sheathed. That means that the housing part is substantially formed from the copper of the main body and is covered with a steel layer. The steel layer can be formed by a layer composed of high-grade steel, for example.

Furthermore, the housing part can have holes or openings, for example, through which electrical leads, for example, in the form of contact legs can project from that side of the housing part which faces away from the mounting part to the side on which the mounting part is arranged. The electrical leads can be provided for making electrical contact with the laser diode chip, for example, via a wire connection between an electrical lead and the laser diode chip.

In accordance with a further embodiment, in addition to the housing part, the mounting part is also steel-sheathed. In particular, in this embodiment, the housing part and the mounting part can have a common copper main body covered with a steel layer.

In particular, the housing can be embodied as a so-called TO housing, for example, having a structural size TO38, TO56 or TO90. The housing part can also be designated as "base plate," and the mounting part as "stem." In comparison with standard TO housings which are usually used and which have at least one housing part or a housing part and a mounting part which substantially consist of steel and do not have a copper-based main body, the housing described here has a higher thermal conductivity on account of the copper of the steel-sheathed housing part.

In accordance with a further embodiment, the housing has a housing cover, which is applied on the housing part and is welded to the housing part. For this purpose, it is particularly advantageous that the housing part is steel-sheathed since as a result, as in the case of a standard TO housing having a steel base, the housing cover can be welded to the housing part. The mounting part projects into the housing cover from the housing part along its extension direction, such that the laser diode chip, with the housing cover mounted, is situated on the mounting part in the cavity formed by the housing cover and the housing part. The housing cover, furthermore, has a window on a side facing away from the housing part, through which window the light emitted by the laser diode chip during operation can be emitted from the laser diode assembly. The housing cover can comprise, for example, steel, in particular high-grade steel, or be composed thereof apart from the window. As a result of the housing part being welded to the housing cover, which is embodied in the form of a cap above the mounting part and thus also above the laser diode chip on the mounting part, the housing can be hermetically or at least very tightly closed.

In accordance with a further embodiment, the laser diode chip is arranged on the mounting part by means of a first solder layer. That means, in particular, that the first solder layer is arranged between the laser diode chip and the mounting part. The first solder layer has a thickness of greater than or equal to 3 µm. Particularly, the thickness of the solder layer can also be greater than or equal to 5 µm.

The laser diode chip can be mounted directly on the mounting part by means of the first solder layer. As an alternative thereto, it is also possible for a heat-conducting element, which is embodied as a so-called heat spreader, to be arranged between the laser diode chip and the mounting part. The heat-conducting element can serve, in particular, to expand or spread the heat flow between the laser diode chip and the mounting part, in order to achieve a large transfer area during heat transfer into the housing, that is to say in particular the mounting part. Furthermore, it can also be possible that the heat-conducting element can compensate, for example, for strains between the laser diode chip and the housing which can be brought about, for example, by different coefficients of thermal expansion thereof.

In accordance with a further embodiment, the heat-conducting element is fixed on the mounting part by means of the first solder layer. The laser diode chip is fixed on the heat-conducting element by means of a second solder layer. By way of example, the second solder layer can also have a thickness of greater than or equal to 3 µm and preferably of greater than or equal to 5 µm. Features and advantages described in connection with the first solder layer can also apply to the second solder layer, and vice versa.

In accordance with a further embodiment, the heat-conducting element comprises silicon carbide (SiC), boron nitride (BN), copper-tungsten (CuW) or diamond or consists thereof. Silicon carbide, boron nitride, copper-tungsten and diamond can be distinguished by a particularly high thermal conductivity. As an alternative thereto, the heat-conducting element can also comprise aluminum nitride.

In the case of the laser diode assembly described here, therefore, between the main body of the copper-based mounting part and the laser diode chip, which usually have different coefficients of thermal expansion, there may be situated one or more materials having likewise different coefficients of thermal expansion, in particular the first solder layer and furthermore, for example, a steel sheathing of the mounting part and/or one or more further solder layers and/or a heat-conducting element. As a result, during operation, thermally induced strains can form between the laser diode chip and the housing or between the laser diode chip and the heat-conducting element and also between the heat-conducting element and the housing, which strains can adversely affect the operation of the laser diode assembly. While it is customary in the prior art to keep the thickness of a solder layer by means of which a laser diode chip is mounted as thin as possible, in particular below 2 µm, in order to achieve the best possible heat dissipation, in the case of the laser diode assembly described here the first solder layer, and, if appropriate, also the second solder layer, is used with a preferably considerably larger thickness. The higher thermal resistance of such a solder layer is accepted here since such a thick solder layer can prove to be advantageous for compensating for thermally induced strains between the housing and the laser diode chip. By way of example, a solder layer described here can comprise an indium-based soft solder in order to be able to compensate particularly well for different thermal expansions. In the case of the laser diode assembly described here, therefore, it is possible to use materials such as silicon carbide, boron nitride, copper-tungsten or diamond as heat-conducting element, which have a higher thermal conductivity in comparison with aluminum nitride but also have significantly more different coefficients of thermal expansion in comparison with the customary materials for laser diode chips.

In accordance with a further embodiment, the laser diode chip is based on a nitride compound semiconductor material. The laser diode chip can comprise, in particular, a substrate, preferably an electrically conductive substrate, for example, crystalline (In, Al, Ga)N. Thereabove an epitaxial layer sequence, that is to say epitaxially grown semiconductor layers, can be applied, which is based on a nitride compound semiconductor material and is thus embodied on the basis of InAlGaN.

InAlGaN-based compound semiconductor materials, (In, Al,Ga)N-based compound semiconductor materials and nitride compound semiconductor materials include, in particular, those which comprise a material from the III-V compound semiconductor material system $In_xAl_yGa_{1-x-y}N$ where $0 \leq x \leq 1$, $0 \leq y \leq 1$ and $x+y \leq 1$, that is to say, for example, GaN, AlN, AlGaN, InGaN, AlInGaN. The laser diode chip can have, in particular, on the substrate a semiconductor layer sequence having an active layer, particularly preferably on the basis of AlGaInN and/or InGaN, which is provided for emitting light during operation. In particular, the laser diode chip can emit light from an ultraviolet to green wavelength range during operation.

In accordance with a further embodiment, the laser diode chip has semiconductor layers on the substrate, said semiconductor layers having, for example, the active layer between waveguide layers and cladding layers. In particular, it is possible to apply on the substrate a first cladding layer, thereabove a first waveguide layer, thereabove the active layer, thereabove a second waveguide layer and above the latter a second cladding layer. Above the second cladding layer, it is furthermore possible to arrange a semiconductor contact layer and, above the latter, an electrical connection layer, for example, in the form of a metal layer. Electrical contact can be made with the laser diode chip particularly preferably via the electrical connection layer situated opposite the substrate and also via the conductive substrate, wherein the substrate can also have an electrical connection layer on the side facing away from the semiconductor layers. On that side of the active layer which faces away from the substrate, a charge carrier barrier layer can furthermore be arranged between the waveguide layer and the cladding layer in order to avoid a so-called charge carrier overshoot.

By way of example, the semiconductor layers arranged between the substrate and the active layer can be n-doped and the semiconductor layers arranged above the active layer as seen from the substrate can be p-doped. As an alternative thereto, it is also possible to reverse the doping order. The active layer can be undoped or n-doped. The laser diode chip can have as active layer, for example, a conventional pn junction, a double heterostructure or a quantum well structure, particularly preferably a multiquantum well structure (MQW structure). In the context of this application, the designation quantum well structure encompasses, in particular, any structure in which charge carriers can experience a quantization of their energy states as a result of confinement. In particular, a quantum well structure can have quantum wells, quantum wires and/or quantum dots and a combination of these structures. By way of example, the active layer can have InGaN-based quantum films between suitably embodied barrier layers.

In accordance with a further embodiment, the laser diode chip, as described above, is based on a nitride compound semiconductor material and has a non-polar or semi-polar crystal structure. Nitride compound semiconductor materials have a wurtzite lattice structure and are usually grown in such a way that the growth direction corresponds to the crystallographic c-axis and the growth plane thus corresponds to the [0001] crystal plane. This growth leads to a polar crystal structure that generates in the semiconductor crystal internal piezoelectric fields that bring about an internal polarization, whereby the injection of charge carriers into the active layer and the distribution of the charge carriers in the active layer are made more difficult. As described in the document U. Strauss, et al., physica status solidi, vol. 248, pages 652-657, 2010, simulations of a polar crystal structure show that in the case of a polar crystal structure in an active layer having a quantum well structure having quantum films, injection barriers of a few 100 mV per quantum film can arise, depending on the emission wavelength of the quantum films. The document D. Sizov, et al., IEEE Journal of Selected Topics in Quantum Electronics, vol. 17, no. 5, pages 1390-1401, 2011, describes a reduction of the injection barriers by means of semi-polar crystal interfaces.

Here and hereinafter "non-polar" or "semi-polar" crystal structures denote crystal structures whose growth direction and thus whose vertical current direction during operation deviates from the crystallographic c-axis of the nitride compound semiconductor material and, in particular, is not parallel and which therefore have a growth plane which deviates from the [0001] plane and is not parallel thereto. Examples of non-polar crystal structures are, for instance, the following directions or growth planes: [1-100], [11-20] and all crystal planes between these. Semi-polar planes are all crystal planes between the [0001] plane and a non-polar crystal plane. A non-polar or semi-polar crystal structure can be achieved, for example, by growing the semiconductor layers on a non-polar or semi-polar substrate surface.

The non-polar or semi-polar crystal structure of the laser diode chip can thus make it possible to reduce the voltage drop and thus the power loss in the active layer of the laser diode chip in comparison with a laser diode chip which is based on a nitride compound semiconductor material and has a polar crystal structure. In the case of laser diode chips having non-polar or semi-polar crystal structures, however, heretofore it has not been possible to achieve forward voltages which, for the same current, are lower than those of light-emitting diode chips having polar crystal structures. The inventors attribute this to a higher contact resistance, in particular on that side of the semiconductor layers which faces away from the substrate toward the electrical connection layer. In the case of a p-doped semiconductor contact layer on that side of the active layer which faces away from the substrate, this can be attributed, for example, to the difficult p-type dopability of nitride compound semiconductor materials.

In particular, the laser diode chip described here can be embodied in such a way that, in comparison with a laser diode chip which is based on a nitride compound semiconductor material and has a polar crystal structure, during operation the laser diode chip has a higher power loss in the semiconductor layers on that side of the active layer which faces away from the substrate, and has a lower power loss in the active layer, than the laser diode chip based on a nitride compound semiconductor material having a polar crystal structure.

As described further above, in comparison with the use of a standard TO housing composed of high-grade steel, the use of a housing, for example, of a TO housing, which is based on copper or has a copper core and a steel surface, taken by itself, does not result in an improvement in the laser power, while the use of laser diode chips having a non-polar or semi-polar crystal structure in a nitride compound semiconductor material does not lead to an improvement in the forward voltage. The use of a solder layer having a thickness of greater than or equal to 3 μm also appears to be counterproductive owing to the higher thermal resistance.

However, the inventors have recognized that the combination of the above-described housing having the copper main body, the laser diode chip based on a nitride compound semiconductor material having a non-polar or semi-polar crystal structure and the first solder layer having a thickness of greater than or equal to 3 μm is particularly advantageous in order to achieve higher output powers in comparison with known laser diode assemblies. Contrary to the prior art in the case of other laser systems such as, for example, GaAs-based laser diode chips in TO housings, the inventors have recognized that it is advantageous to produce a large temperature gradient during operation within the laser diode chip, which is possible by virtue of the targeted choice and combination of the components of the laser diode assembly described here. In particular, as a result of the different power loss distribution in comparison with a customary laser diode chip based on a nitride compound semiconductor material having a polar crystal structure and as a result of the copper of the main body of the housing in turn, a large temperature gradient is obtained in the laser diode chip and, in contrast thereto, a small temperature gradient is obtained in the housing material, wherein the good thermal conductivity of the copper main body, as described above, is not advantageous by itself, but rather in combination with the laser diode chip described here. The combination of the housing described here with the laser diode chip described here is furthermore possible precisely by virtue of the fact that a first solder layer which is significantly thicker in comparison with the prior art and appears to be counterproductive with regard to the higher thermal resistance is used.

Furthermore, it is advantageous, in the case of the laser diode assembly described here, in comparison with known laser diode chips, to increase the area of the active layer of the laser diode chip. In particular, the active layer can have an area of greater than or equal to 10,000 μm$^2$ and preferably of greater than or equal to 20,000 μm$^2$ up to 30,000 μm$^2$. A decrease in the current density from a maximum value to 10% is assumed here as area limitation.

As described above, an increase in the area of the active layer alone is counterproductive with regard to achieving a higher output power of the laser diode chip. The inventors have recognized, however, that it is only through the combination with the above-described temperature gradient in the laser diode chip that a higher output power can be achieved, which is made possible by the laser-light-generating chip area energized over a larger area. The temperature gradient in the laser diode chip in turn can be achieved only as a result of a reduced evolution of heat and a better heat dissipation in and from the active layer in combination with a hotter electrical contact in comparison with the prior art on that side of the active layer which faces away from the substrate.

The impairment of the electrical contact on that side of the active layer which faces away from the substrate, that is to say the targeted establishment of a higher power loss in comparison with the prior art, is in this case not just compensated for by the lower losses in the active layer, but is overcompensated for by the possible high-current operation, for example, by a larger area of the active layer, and the temperature gradient set in a targeted manner in the laser diode chip, such that a significant improvement in the form of an increase in the output power can be achieved precisely through the combination of the measures described here in comparison with the prior art. In the case of the laser diode assembly described here it is possible to achieve, in particular, a higher optical output power in the range of a plurality of watts, in particular of more than 3 W, and also a higher conversion efficiency of the electrical input power into optical output power.

In accordance with a further embodiment, the mounting part has, perpendicular to the extension direction, a cross section which projects, at least at one side, as far as a housing cover arranged above the mounting part and fitted on the housing part. In other words, in a plane perpendicular to the extension direction the mounting part has a thickness such that the mounting part reaches as far as the housing cover. In this case, a gap can still be present between the mounting part and the housing cover. As an alternative thereto, the mounting part can also touch the housing cover. It is particularly advantageous if the mounting part reaches as far as the housing cover over the largest possible area.

In accordance with a further embodiment, the housing part and the housing cover have a circular cross section in a plane perpendicular to the extension direction of the mounting part.

The mounting part can particularly advantageously have a cross section occupying more than a semicircular circle segment, that is to say more than a semicircular area, in a plane perpendicular to the extension direction. The thicker the mounting part is made and the larger, therefore, the cross-sectional area of the mounting part perpendicular to the extension direction, the greater the heat dissipation through the housing. The space not filled by the mounting part within the housing cover is provided for mounting the laser diode chip.

Furthermore, it can also be possible that the cross section of the mounting part increases in size in the direction of the housing part. By way of example, the mounting part can have a wedge-shaped cross section in a plane along the extension direction and can thus become wider and/or thicker relative to a mounting plane of the mounting part on which the laser diode chip is arranged. In comparison with a standard TO housing, the laser diode chip on such a mounting part can emit in an oblique direction, which makes it possible to achieve the effect, for example, that the mounting part can have the largest possible thickness and width, without the occurrence of shading through the window of the housing cover.

In order to compensate for the oblique emission direction in the case of a wedge-shaped cross section of the mounting part, the housing part can have a wedge-shaped cross section in a plane parallel to the extension direction. As an alternative or in addition thereto, the connecting angle between the housing part and the mounting part can also be not equal to 90°, wherein a connecting angle of 90° corresponds to the standard arrangement of a mounting part on a housing part of a standard TO housing. What can thereby be achieved is that despite obliquely directed emission through the laser diode chip, the laser diode assembly can emit the light generated by the laser diode chip approximately at a right angle with respect to a mounting area of the housing, by means of which mounting area the laser diode assembly can be mounted on a carrier such as, for instance, a printed circuit board. Alternatively, it is also possible, for example, to fit an auxiliary ring to the housing part, whereby oblique mounting of the housing and thus of the laser diode assembly can be achieved.

In accordance with a further embodiment, the laser diode chip has a radiation coupling-out area, via which the light generated in the active layer is emitted during operation. The laser diode chip is preferably embodied as an edge-emitting laser diode chip, in which the radiation coupling-out area can be produced, for example, by breaking, cleaving and/or etching a semiconductor layer composite assemblage along a crystal plane. Furthermore, the laser diode chip has a rear side area arranged opposite the radiation coupling-out area. In particular, a region of a front side area of the laser diode chip via which the coherent light generated in the laser diode chip is emitted can be designated as the radiation coupling-out area. The front side area, in particular also the radiation coupling-out area, and the rear side area are usually also designated as so-called facets in the case of edge-emitting laser diode chips. Furthermore, the laser diode chip has side areas which connect the rear side area and the radiation coupling-out areas to one another and which are formed by the sides of the semiconductor layers in a direction perpendicular to the growth and arrangement direction of the semiconductor layers.

In accordance with a further embodiment, the laser diode chip has a crystalline protective layer at least on the radiation coupling-out area. Here, and hereinafter, "crystalline" layer denotes a layer having in its entirety a crystalline structure, that is to say a short-range and a long-range order. In contrast thereto, an amorphous layer has only a short-range order and a part-crystalline or partially crystalline layer also has a long-range order only in parts or regions, but said long-range order is not continued over the entire layer.

In particular, the crystalline protective layer can be hermetically impermeable, in particular hermetically impermeable in the region of the radiation coupling-out area, that is to say preferably the region of the front side area of the laser diode chip via which the laser radiation is emitted during operation. In this case, a hermetically impermeable layer can have, in particular, an impermeability which is high enough that the area of the laser diode chip which is covered by the hermetically impermeable layer is protected during the lifetime of the laser diode chip and of the laser diode assembly in such a way that no damage that shortens the lifetime occurs. In particular, the crystalline protective layer can have a higher impermeability than, for example, an amorphous or a partially crystalline layer. This can be based, for example, on the fact that the crystalline layer is preferably embodied without lattice defects, so-called "pin holes," which can bring about leakages.

The crystalline protective layer can protect the areas of the laser diode chip which are covered by the crystalline protective layer, that is to say at least the radiation coupling-out area, against environmental influences such as, for instance, damaging gases. Such environmental influences can be formed, for example, by oxygen, ozone, substances contained in acid rain, and other chemicals. For example, when the laser diode assembly is used as a light source in automotive engineering, the laser diode chip and in particular the radiation coupling-out area thereof can be jeopardized in the case of an unprotected laser diode chip on account of aggressive media such as, for instance, hydrocarbons and sulfur and nitrogen compounds, for example, hydrogen sulfide and sulfur and nitrogen oxides. Such damaging environmental influences can penetrate into the housing of the laser diode assembly as far as the laser diode chip, for example, when the housing itself is not sealed hermetically impermeably relative to the surroundings. In the case of the housing of the laser diode assembly described here, on account of the different coefficients of thermal expansion there is a particular technical challenge, when closing the housing, in welding the housing based on copper or on steel-sheathed copper to a steel-based housing cover with a sufficient impermeability. Particularly in the high-volume manufacture of such components, an increase in the escape rate of components having a residual leakage can occur. Although it is known to provide the facets of laser diode chips with sheathings, the latter are usually amorphous to partially crystalline and, on account of their gray boundaries and imperfections, can prevent the diffusion of facet-damaging materials only to an insufficient extent. The crystalline protective layer thus constitutes an additional protection-ensuring reliable use of the laser diode assembly—of, in particular, the critical radiation coupling-out area.

Furthermore, the thick solder layers described here between the laser diode chip and the housing, for example, the first solder layer, can have the effect that solder particles migrate via the surfaces of the laser diode chip, in particular in regions of the laser facets. Without a sufficiently impermeable facet sheathing, the solder particles can diffuse through the facet sheathing, which can lead to leakage currents via the laser facets. The crystalline protective layer described here can ensure a sufficiently impermeable facet sheathing which can prevent damage to the laser diode chip caused by solder particles. By means of the crystalline protective layer, in the case of a crystalline dielectric material, it is additionally possible to achieve a significant increase in the breakdown field strength, whereby it is possible to achieve protection against electrical breakdown, for example on account of a solder layer running up or a p-type metallization hanging over the facet.

In accordance with a further embodiment, the laser diode chip is provided with the crystalline protective layer at least on the radiation coupling-out area during the production of the laser diode assembly. For this purpose, an application method is used by means of which a crystalline dielectric, semiconducting or conducting layer can be produced. By way of example, it is possible to choose a method for chemical vapor deposition (CVD) at elevated temperatures, in particular at temperatures of greater than or equal to 500° C. and preferably of greater than or equal to 600° C. Particularly preferably, the crystalline protective layer can also be implemented by deposition by means of an atomic layer deposition (ALD) method, in particular an atomic layer epitaxy (ALE) method. The atomic layer deposition methods, too, can be carried out at elevated temperatures—in comparison with customary methods for producing facet sheathings—of greater than or equal to 500° C. and preferably of greater than or equal to 600° C., in order to obtain the crystalline protective layer. What is advantageous about the methods mentioned, in particular an atomic layer deposition method, is the defect-free, "pin hole"-free structure, a good adhesion on surfaces, a high stability, a good overforming even of unevennesses with a high aspect ratio, and a low-strain structure. What is particularly advantageous in the case of such protective layers is the low permeability thereof toward gases, for example, oxygen or moist air, as described, for example, in the documents P. F. Carcia, et al., Journal of Applied Physics 106, 023533 (2009) and T. Hirvikorpia, Applied Surface Science 257, 9451-9454 (2011).

In accordance with a further embodiment, the crystalline protective layer has exactly one crystalline layer. As an alternative thereto, it is also possible for the crystalline protective layer to have a plurality of crystalline layers. The plurality of crystalline layers can be formed, for example, by a plurality of crystalline layers composed of different materials. Furthermore, it is also possible for the plurality of crystalline layers to be formed by an alternating sequence of at least two crystalline layers composed of different materials.

In accordance with a further embodiment, an optical layer is applied on the radiation coupling-out area. The optical layer can be, for example, a reflective or antireflective layer. Such optical layers usually have one and preferably a plurality of layers composed of transparent materials which can form a periodic sequence of different refractive indices.

By way of example, the crystalline protective layer can form the optical layer. This can be advantageously possible in particular when the crystalline protective layer has a plurality of crystalline layers. As an alternative thereto, it is also possible for an optical layer to be applied in addition to the crystalline protective layer, which optical layer need not necessarily be crystalline, but rather can be, for example, amorphous or partially crystalline. In this case, the optical layer can be applied by means of a conventional application method such as is known from the prior art for facet sheathings.

The optical layer can be arranged between the radiation coupling-out area and the crystalline protective layer, for example, and can be covered by the crystalline protective layer. This can make it possible that, in addition to the radiation coupling-out area, the optical layer is also protected by the crystalline protective layer. As an alternative thereto, it is also possible for the crystalline protective layer to be arranged between the radiation coupling-out area and the optical layer. In this case, the crystalline protective layer is advantageously arranged as near as possible and particularly preferably directly on the laser diode chip, that is to say at least on the radiation coupling-out area. In combination with an additional optical layer, the crystalline protective layer can also have a part of the optical functionality of the sheathing and thus be a part of the optical layer.

In accordance with a further embodiment, the crystalline protective layer is formed by a dielectric material or at least comprises a dielectric material. Particularly, in the case of a direct and immediate sheathing of the radiation coupling-out area and, if appropriate, further areas of the laser diode chip, a dielectric layer is advantageous since short circuits of the laser diode chip can thereby be avoided. In combination with an optical layer or else a passivation layer between the crystalline protective layer and the laser diode chip, the crystalline protective layer can also comprise a semiconducting or conducting material or be composed thereof.

Particularly preferably, the crystalline protective layer can be formed by an oxide or at least comprise an oxide. By virtue of the oxygen of the oxidic material, hydrogen bridge bonds can be formed with water molecules, for example, whereby the water molecules can be prevented from penetrating into the crystalline layer. Particularly preferably, the oxide can be dielectric.

Particularly preferably, the crystalline protective layer can comprise in one or in a plurality of crystalline layers one or a plurality of the following materials: $Al_2O_3$, $Si_3N_4$, $Nb_xAl_yO_z$, $Al_2O_3/TiO_2$, $Al_2O_3/Ta_2O_5$, $HfO_2$, $Ta_2O_5/ZrO_2$, $Ta_2O_5$, $Ta_xTi_yO_z$, $Ta_2O_5/NbO_5$, $TiO_2$, $ZrO_2$, $HfO_2$, $Ta_2O_5$, $Nb_2O_5$, $Sc_2O_3$, $Y_2O_3$, $MgO$, $B_2O_3$, $SiO_2$, $GeO_2$, $La_2O_3$, $CeO_2$, $PrO_x$, $Nd_2O_3$, $Sm_2O_3$, $EuO_x$, $Gd_2O_3$, $Dy_2O_3$, $HO_2O_3$, $Er_2O_3$, $Tm_2O_3$, $Yb_2O_3$, $Lu_2O_3$, $SrTiO_3$, $BaTiO_3$, $PbTiO_3$, $PbZrO_3$, $Bi_xTi_yO$, $Bi_xSi_yO$, $SrTa_2O_6$, $SrBi_2Ta_2O_9$, $YScO_3$, $LaAlO_3$, $NdAlO_3$, $GdScO_3$, $LaScO_3$, $LaLuO_3$, $Er_3Ga_5O_{13}$, $HfSiO$, $HfSiO$, $AlSiO$, $LaAlO$, $LaHfO$, $In_2O_3$, $ZnO$, $Ga_2O_3$, $V_2O_5$, $HfAlO$, $HfTaO$, $HfZrO$, Ru, Pt, Ir, Td, Rh, Ag, W, Cu, Co, Fe, Ni, Mo, Ta, Ti, Al, Si, Ge, $In_2O_3$, $In_2O_3$:Sn, $In_2O_3$:F, $In_2O_3$:Zr, $SnO_2$, $SnO_2$:Sb, ZnO:Al, ZnO:B, ZnO:Ga, $RuO_2$, $RhO_2$, $IrO_2$, $Ga_2O_3$, $V_2O_5$, $WO_3$, $W_2O_3$, BN, AlN, GaN, InN, $SiN_x$, $Ta_3N_5$, $Cu_3N$, $Zr_3N_4$, $Hf_3N_4$, NiO, CuO, $FeO_x$, $CrO_x$, $CoO_x$, $MnO_x$TiN, $Ti_xSi_yN_z$, NbN, TaN, $Ta_3N_5$, $MoN_x$, $W_2N$, GaAs, AlAs, AlP, InP, GaP, InAs, TaC.

In accordance with a further embodiment, a crystalline protective layer is likewise applied on the rear side area of the laser diode chip situated opposite the radiation coupling-out area. The facets of the laser diode chip that are sensitive toward environmental influences can be effectively protected by the crystalline protective layer on the radiation coupling-out area and also on the rear side area.

Furthermore, an optical layer, in particular a reflective layer, can also be applied on the rear side area. As described further above for the sheathing of the radiation coupling-out area, it is possible on the rear side area, too, to arrange the optical layer between the crystalline protective layer and the rear side area. As an alternative thereto, the crystalline protective layer can also be arranged between the optical layer and the rear side area. It can also be particularly advantageous if the optical layer on the rear side area of the laser diode chip is formed by the crystalline protective layer.

In accordance with a further embodiment, one or more crystalline protective layers are applied on side areas of the laser diode chip that connect the rear side area and the radiation coupling-out area. In particular, it can be advantageous if a crystalline protective layer is applied on all side areas arranged perpendicular to the growth and arrangement direction of the semiconductor layers and also on the facets of the laser diode chip, such that the semiconductor layers and the interfaces between semiconductor layers are protected all around.

BRIEF DESCRIPTION OF THE DRAWINGS

Further advantages, advantageous embodiments and developments will become apparent from the exemplary embodiments described below in conjunction with the figures.

In the Figures.

In the exemplary embodiments and figures, elements that are identical, of identical type or act identically may in each case be provided with the same reference signs. The illustrated elements and their size relationships among one another should not be regarded as true to scale; rather, individual elements such as, for example, layers, structural parts, components and regions may be illustrated with an exaggerated size in order to enable better illustration and/or in order to afford a better understanding.

DETAILED DESCRIPTION OF ILLUSTRATIVE EMBODIMENTS

Attempts have been made to increase the optical output power by increasing the dimension of the optical resonator, that is to say in particular the chip area, since a long-term aging behavior dependent on current density has been found in the case of nitride-based laser diodes, as described, for example, in the document S. Lutgen, et al., Proc. SPIE, vol. 7953, page 79530G, 2011. Moreover, increasing the active area also makes it possible to improve the heat transport from the light-generating layer in the direction of a heat sink.

Figure 1A:
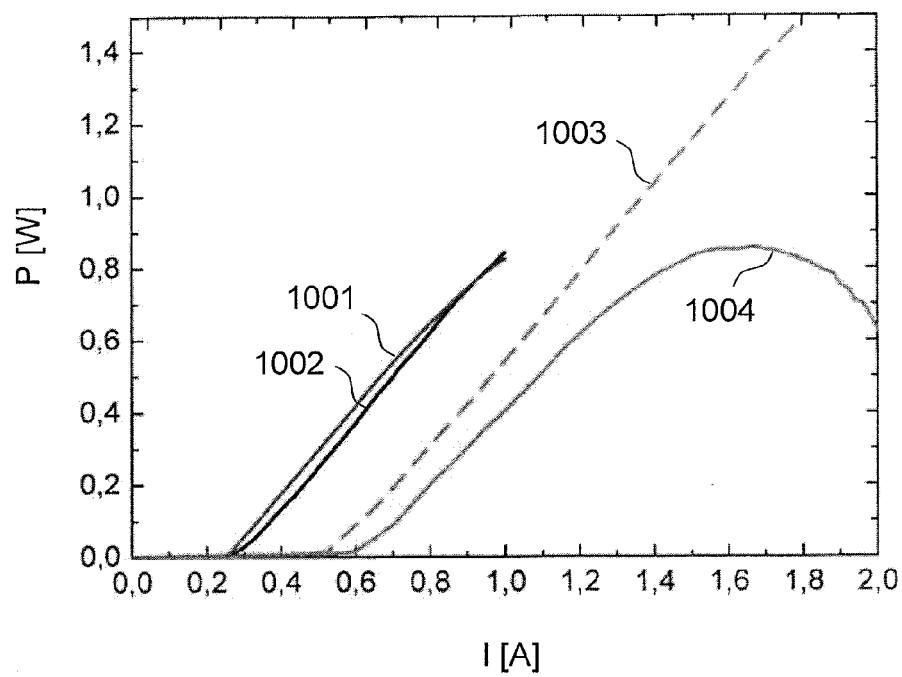
FIGS. 1A and 1B show measurements for conventional laser diode assemblies.

The inventors of the present application have discovered in their own investigations and studies, however, that increasing the chip area does not lead to an increase in power. In this respect, FIG. 1A shows, for blue-emitting laser diode chips based on a nitride compound semiconductor material, measurements of the optical output power P (in watts) as a function of the operating current I (in amperes). The laser diode chips used for the measurement were in this case each situated in a TO housing. For two individual chips each having a component size of 200 µm×1,200 µm and an active area of 15 µm×1,200 µm, the measurement curves 1001 and 1002 were determined. In order to achieve higher powers, the above-described approach for doubling the chip area was investigated. The increase in power expected from such doubling is indicated in the form of the dashed line 1003. It has been found, however, that, contrary to expectations, the achievable maximum power with doubled chip area is even lower still than in the case of the individual chips, as can be seen from the curve 1004 for a laser diode chip having a doubled active area in comparison with the previously described individual chips.

In order to increase the efficiency of the generation of light in laser diode chips, for example, by reducing injection barriers for electrons and holes during current flow into the light-generating quantum films, laser diode chips grown on non-polar or semi-polar substrates are furthermore known, as described, for example, in the document U. Strauss, et al., physica status solidi, vol. 248, pages 652-657, 2010. As described in the document D. Sizov, et al., IEEE Journal of Lightwave Technology, vol. 30, pages 679-699, 2012, however, the achievable electrical voltages for such laser diode chips grown in non-polar or semi-polar fashion are no better than for corresponding polar-grown laser diode chips.

Alongside the standard TO housings composed of high-grade steel, TO housings are also known which, for the purpose of better heat dissipation, have a base which is based on copper or has a copper core and a steel surface, as described, for example, in the German patent document DE 1184870, and which are intended to lead to an improvement in the heat dissipation from laser diode chips on account of the copper having good thermal conductivity.

Figure 1B:
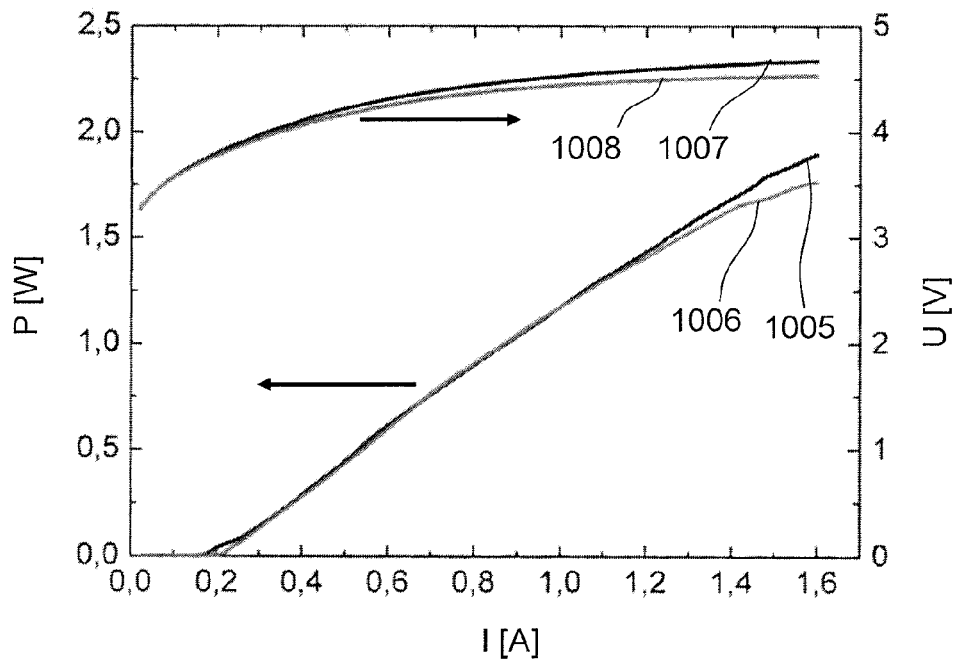

FIG. 1B shows, on the basis of investigations by the inventors, measurements of the optical output power P (in watts) and of the operating voltage U (in volts) of laser diode chips in different TO housings as a function of the operating current I (in amperes). The curves 1005 and 1007 show the current-dependent optical power and the associated operating voltage of a blue-emitting GAN laser diode chip in a customary TO56 standard housing having a steel base ("base plate") and a copper mounting part ("stem"), while the curves 1006 and 1008 show corresponding measurements for a laser diode chip in an alternative TO56 housing having a steel-sheathed copper base and a steel-sheathed copper mounting part. As can readily be discerned, the alternative housing having a base that is based on steel-sheathed copper does not lead straightforwardly to an improvement in the maximum power of the laser diode chips. Therefore, the approach of such alternative TO housings has not been pursued further by any laser diode manufacturer for nitride-based laser diodes.

Figure 2A:
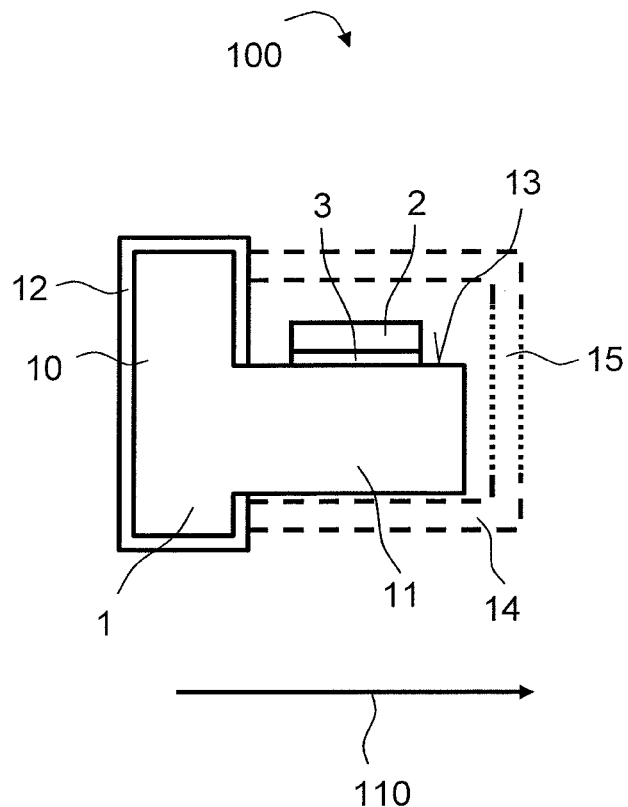
FIGS. 2A and 2B show schematic illustrations of a laser diode assembly in accordance with an exemplary embodiment.
Figure 2B:
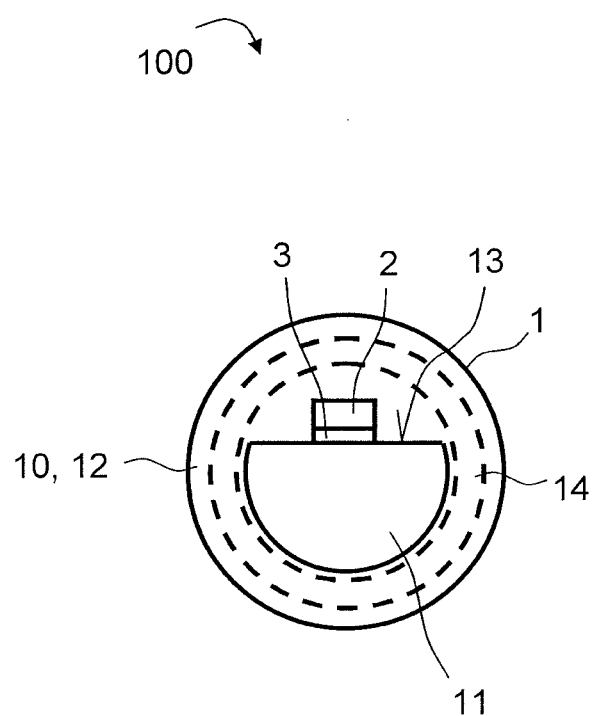

FIGS. 2A and 2B show an exemplary embodiment of a laser diode assembly 100, wherein FIG. 2A shows a schematic sectional illustration and FIG. 2B a plan view of the front side of the laser diode assembly 100 counter to the direction 110 shown in FIG. 2A. The following description relates equally to FIGS. 2A and 2B.

The laser diode assembly 100 comprises a housing 1 embodied in the form of a so-called TO housing. The housing 1 has a housing part 10 and a mounting part 11 arranged at the housing part. The mounting part 11 extends away from the housing part 10 along the extension direction 110 and is embodied integrally with the housing part 10 in the exemplary embodiment shown. For this purpose, the housing part 10 and the mounting part 11 have a main body formed from copper. The housing part 10 furthermore has a sheathing 12 composed of steel, which is formed by a sheathing of the copper main body in the region of the housing part 10.

Furthermore, the housing part 10 can have holes or openings, for example, in which are arranged small lead legs projecting from that side of the housing part 10 which faces away from the mounting part 11 to the side of the mounting part 11. Small lead legs arranged and fixed therein can be embodied as electrical feedthroughs, for example, and afford possibilities for electrical contact-making.

The mounting part 11 has a mounting area 13, on which a laser diode chip 2 is arranged. In particular, the laser diode chip 2 is mounted on the mounting area 13 of the mounting part 11 by means of a first solder layer 3, and is thereby electrically and thermally connected to the housing 1.

A housing cover 14 can be arranged above the mounting part 11 and thus above the laser diode chip 2, said housing cover being indicated by the dashed lines. The housing cover 14, which can furthermore have a window 15, can comprise steel, for example, and preferably be composed of steel apart from the window 15. By virtue of the fact that the housing part 10 has the steel sheathing 12, the housing cover 14 can be applied on the housing part 10 of the housing 1 and, as in customary TO housings having steel bases, can be fixed by means of welding in a standard process. Furthermore, by means of welding the housing cover 14 to the sheathing 12 of the housing part 10, it is possible preferably to achieve a connection which is as impermeable as possible and which can protect the laser diode chip 2 against damaging environmental influences.

As can be seen from FIG. 2B, the housing part 10 and the housing cover 14 are embodied in a circular fashion in a plane perpendicular to the extension direction 110. In the exemplary embodiment shown, the mounting part 11 in turn has a cross section occupying more than a semicircular circle segment, that is to say more than a semicircular area. Furthermore, the mounting part 11 projects as far as the housing cover 14 on the side facing away from the mounting area 13. As a result, the mounting part 11 can be made as thick as possible in terms of its cross section, whereby a high thermal conductivity can be achieved.

While it is customary for the purpose of optimum heat dissipation in standard laser diode components to couple a laser diode chip to a housing via a solder layer that is as thin as possible, in order to obtain a thermal resistance that is as low as possible, the first solder layer 3 in the exemplary embodiment shown here has a thickness of greater than or equal to 3 μm and preferably of greater than or equal to 5 μm. It is thereby possible to compensate for thermally induced stresses that occur during operation as a result of the heat generated in the laser chip 2 and the different coefficients of thermal expansion of the laser diode chip 2 and of the housing 1. Furthermore, by way of example, surface unevennesses on the mounting area 13 of the mounting part 11 can also be compensated for by such a thick solder layer. Said unevennesses can in particular also occur if the mounting part 11, as is shown below in FIG. 6, has a sheathing 12 composed of steel like the housing part 10.

Figure 3:
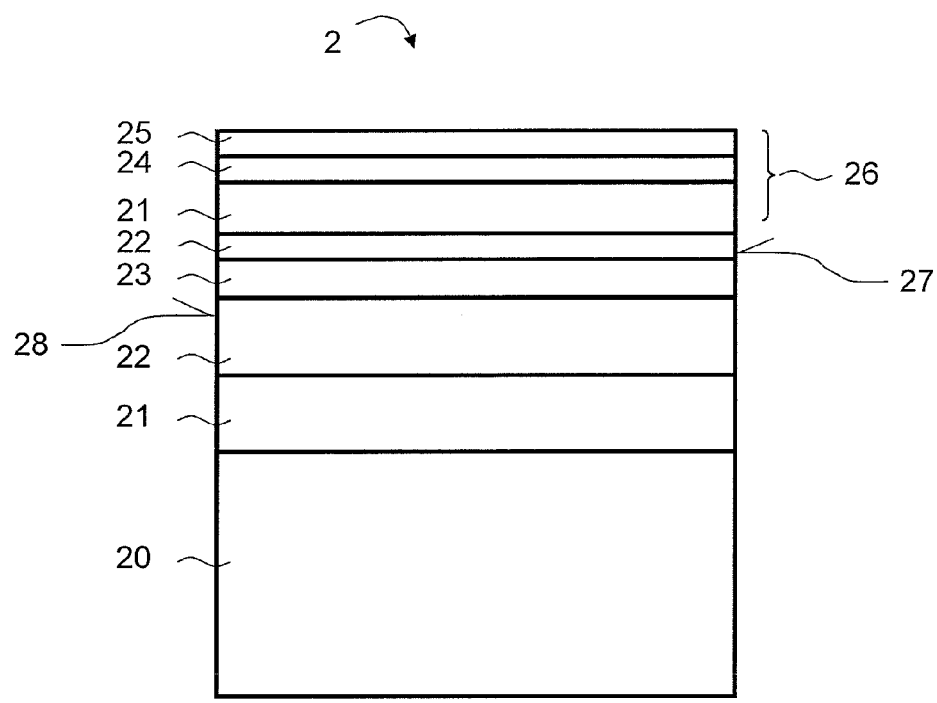
FIG. 3 shows a schematic illustration of a laser diode chip in accordance with an exemplary embodiment.

Preferably, as is shown in FIG. 3, the laser diode chip 2 is formed as an edge-emitting laser diode chip having a radiation coupling-out area 27 formed by a side area and a rear side area 28 situated opposite the radiation coupling-out area. The radiation coupling-out area 27 can be formed, in particular, by that region of the front side area of the laser diode chip 2 via which the laser radiation generated in the laser diode chip 2 is emitted during operation.

In particular, the laser diode chip 2 is based on a nitride compound semiconductor material. For this purpose, the laser diode chip 2 has a substrate 20, which is preferably embodied as electrically conducting and, for example, comprises crystalline (In, Al, Ga)N or is composed thereof. A semiconductor layer sequence based on a nitride compound semiconductor material is grown thereabove, preferably by means of an epitaxy method such as, for example, metal organic vapor phase epitaxy (MOVPE). The laser diode chip 2 has, on the substrate 20, an active layer 23 arranged between waveguide layers 22 and cladding layers 21. In particular, the laser diode chip 2 has a first cladding layer 21 on the substrate 20, on which first cladding layer a first waveguide layer 22 and thereabove the active layer 23 are arranged. Above the active layer 23 there follow in the growth direction a further waveguide layer 22 and also a further cladding layer 21 and thereabove a semiconductor contact layer 24, with which contact is made by an electrical connection layer 25, for example in the form of a metallic electrode layer. The laser diode chip 2 is electrically connected via the electrical connection layer 25 and the electrically conducting substrate 20, which can have a further electrical connection layer (not shown) on the side facing away from the semiconductor layers 21, 22, 23 and 24.

In the exemplary embodiment shown, as seen from the active layer 23, the semiconductor layers facing the substrate 20 are n-doped, while the semiconductor layers arranged on that side of the active layer 23 which faces away from the substrate 20 are p-doped. Alternatively, an opposite doping order is also possible. The active layer 23 can be n-doped or undoped, for example, and can have a multiquantum well structure, in particular, in the exemplary embodiment shown.

Figure 4:
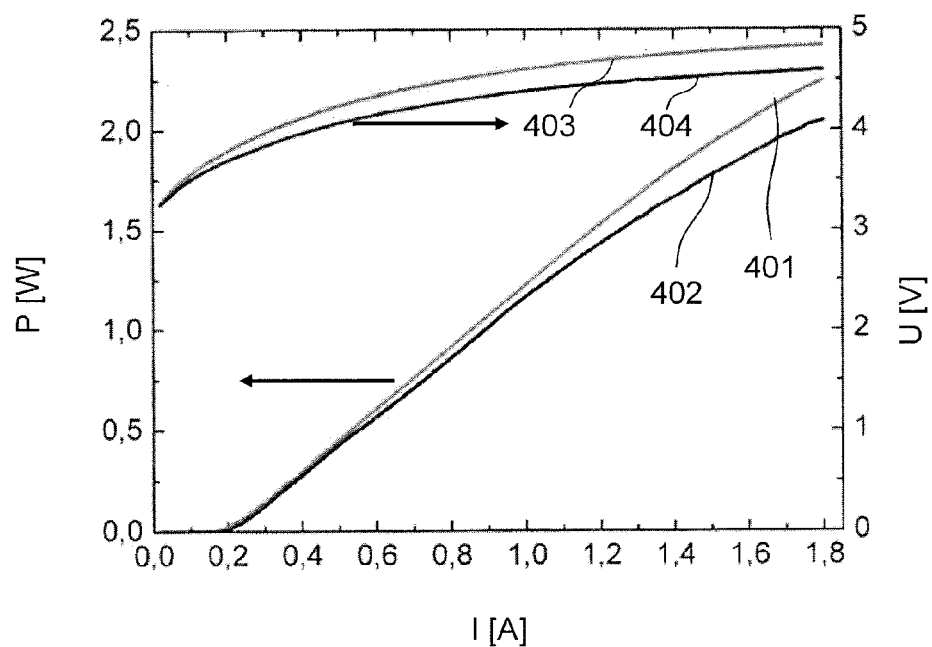
FIGS. 4 to 5B show measurements of laser diode assemblies.

In particular, an improved thermal conductivity in comparison with a standard TO housing composed of steel is achieved by means of the copper-based housing 1. In FIG. 4, in this respect, the curves 401 and 402 show the optical output power P (in watts) and the curves 403 and 404 show the operating voltage U (in volts) in each case as a function of the operating current I (in amperes) for blue-emitting GaN-based laser diode chips, wherein laser diode chips in standard TO56 housings having a base composed of steel and laser diode chips in copper-based housings described here having a housing part composed of steel-sheathed copper, mounted by means of a solder layer thickness of approximately 5 μm, were investigated. A comparison of the curves 401 and 403 for the case of the copper-based housing described here and the thick solder layer with the curves 402 and 404 for the case of the standard TO housing and a thin solder layer shows, despite a higher thermal resistance of the thicker solder, an improvement in the output power when using the housing described here with the first solder layer 3 described here.

In order to achieve the highest possible output power for the light emitted by the laser diode chip 2 during operation, in accordance with a further exemplary embodiment, likewise explained with reference to FIGS. 2A, 2B and 3, specific temperature gradients are produced in the case of the laser diode assembly 100. In particular, a minimum temperature gradient is present in the housing 1, this temperature gradient being achieved by virtue of the copper-based main body of the housing 1.

In contrast to the housing 1 having the highest possible thermal conductivity for producing the smallest possible temperature gradient in the housing 1, the laser diode chip 2 is on the other hand embodied in such a way that the largest possible temperature gradient is present between the electrical connection layer 25 and the substrate 20. In order to set such a targeted temperature gradient, the laser diode chip 2 and the housing 1 have to be coordinated with one another. Investigations by the inventors have shown, in particular, that electrical losses have to be considered separately in the laser diode chip 2. Firstly, it is necessary to take account of the voltage drop at the top side contact—embodied as a p-doped contact in the exemplary embodiment shown—in the region of the layers 26, said voltage drop being caused by the difficult p-type dopability in the nitride semiconductor material system.

Figure 5A:
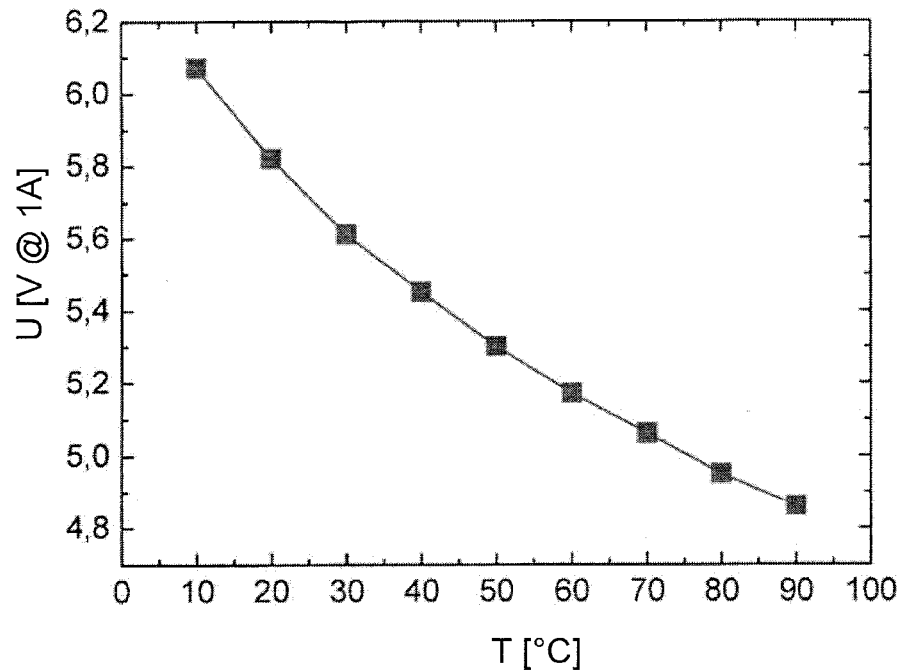
Figure 5B:
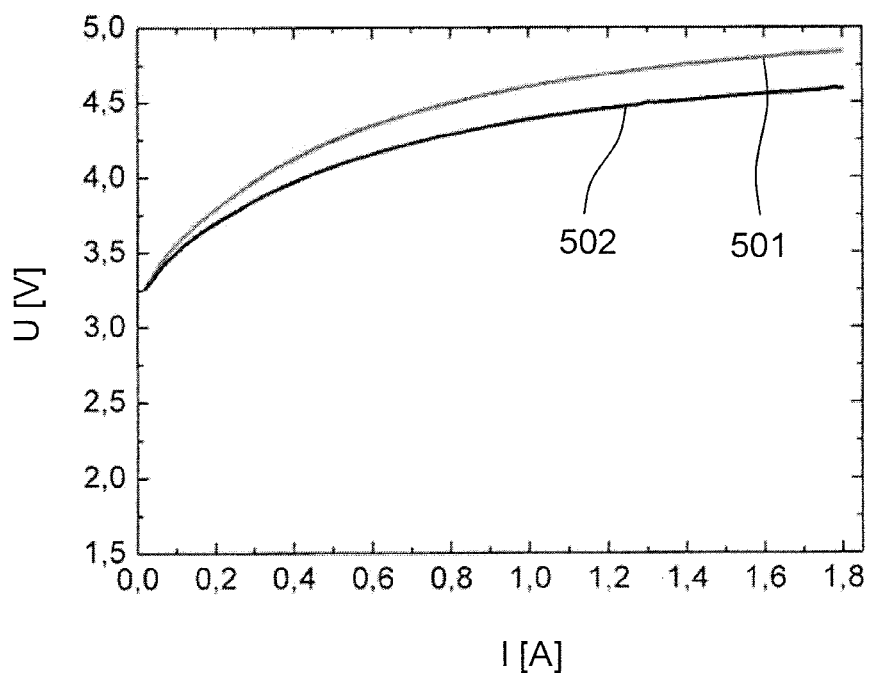

FIG. 5A shows in this respect the electrical voltage of a nitride-based polar laser diode chip 2 in a TO housing for various temperatures (in ° C.) for an operating current of 1 ampere in a pulsed mode having a pulse length of 1 μs and a duty ratio of 1%. FIG. 5B shows the operating voltage U (in volts) as a function of the operating current I (in amperes) for a laser diode assembly having a copper-based housing (curve 501) in comparison with a laser diode assembly having a standard TO56 housing composed of steel (curve 502). In the copper-based housing, the operating voltage rises, from which it can be deduced that the layers 26 are colder in the case of the curve 501 than in the case of the curve 502 on account of the improved heat dissipation.

Secondly, it is necessary to take account of the voltage drop in the underlying layers, and in particular in the active layer 23. Since the active layer 23 in the exemplary embodiment shown is embodied as a multiquantum well structure having a layer stack of light-generating quantum films, a voltage drop arises in particular at the interfaces of the quantum well structure. In this case, the laser diode chip 2 is embodied such that with virtually the same power loss as in the case of standard laser diode chips, electrical barriers and resistances near the top side contact are accepted and losses near or below the active layer 23 are minimized.

For this purpose, the laser diode chip 2 is embodied as a laser diode chip which is based on a nitride compound semiconductor material and has a non-polar or semi-polar crystal structure, described in the general part. What can be achieved by means of the non-polar or semi-polar crystal structure of the laser diode chip 2 is that, in comparison with standard laser diode chips which are based on a nitride compound semiconductor material and have a polar crystal structure, during operation a higher power loss is present on that side of the active layer 23 which faces away from the substrate 20, that is to say in the layers 26, while a lower power loss is achieved in the active layer 23.

The impediment of the electrical contact in the region of the layers 26 above the active layer 23 as a result of a higher electrical power loss in comparison with a conventional laser diode chip based on a nitride compound semiconductor material having a polar crystal structure is not just compensated for by the lower losses in the active layer 23. Rather, an overcompensation is achieved by means of possible high-flow operation and the temperature gradient set in a targeted manner in the laser diode chip 2, such that, in comparison with known laser diode assemblies, a significant improvement is achieved by the combination described here of the housing 1 with the non-polar or semi-polar laser diode chip 2 and the first solder layer 3.

It is particularly advantageous if the chip area of the laser diode chip 2 described here is increased in comparison with known laser diode chips; in particular, impressing current into the active layer 23 over an area of greater than or equal to 10,000 $\mu m^2$ and preferably of greater than or equal to 20,000 to 30,000 $\mu m^2$ is advantageous, wherein a decrease in the current density from a maximum value to 10% thereof is assumed as an area limitation. As a result of the above-described measures which lead to the largest possible temperature gradient in the laser diode chip 2, that is to say an improved heat dissipation from the active layer 23 in combination with a hotter topside contact in the region of the layers 26, an increase in the area into which the current is impressed leads to an increase in the optical output power in comparison with the prior art.

The following figures show further exemplary embodiments of laser diode assemblies which exhibit modifications and variations of the exemplary embodiment illustrated in FIGS. 2A, 2B and 3. Therefore, the following description is restricted essentially to the differences with respect to the previous exemplary embodiment. In particular, the laser diode assemblies described below can have a housing cover, even if the latter is not explicitly shown in the figures.

Figure 6:
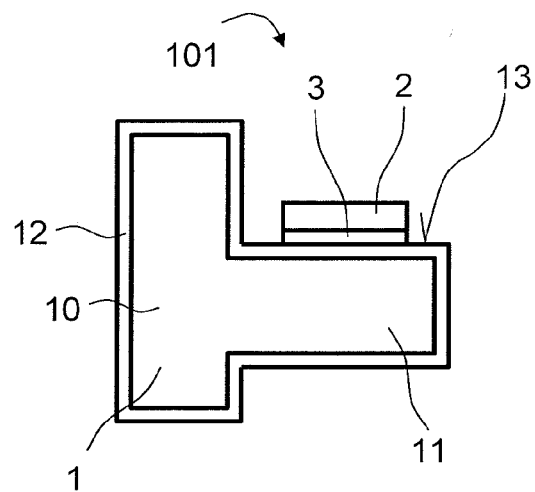
FIGS. 6 to 9 show schematic illustrations of laser diode assemblies in accordance with further exemplary embodiments.

FIG. 6 shows an exemplary embodiment of a laser diode assembly 101 wherein, in comparison with the laser diode assembly 100 in accordance with FIGS. 2A and 2B, not only the housing part 10 but also the mounting part 11 has a sheathing 12 composed of steel. As a result, as in the case of a standard TO housing, it is possible to achieve a mounting area 13 composed of steel, while the thermal conductivity improved by the copper can be obtained at the same time.

Figure 7A:
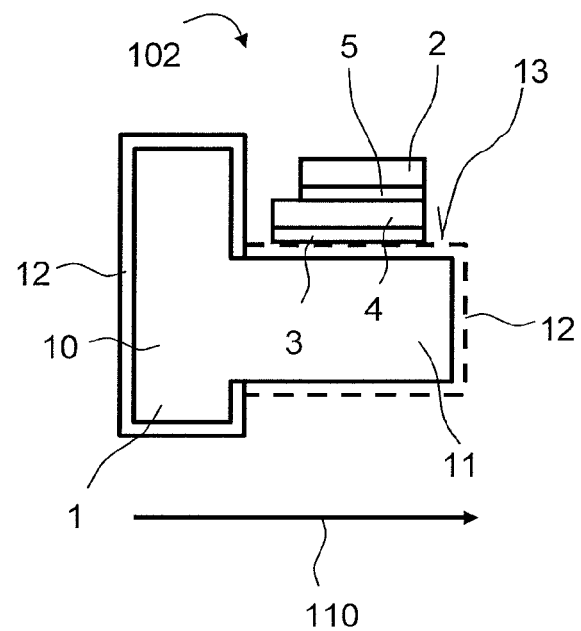
Figure 7B:
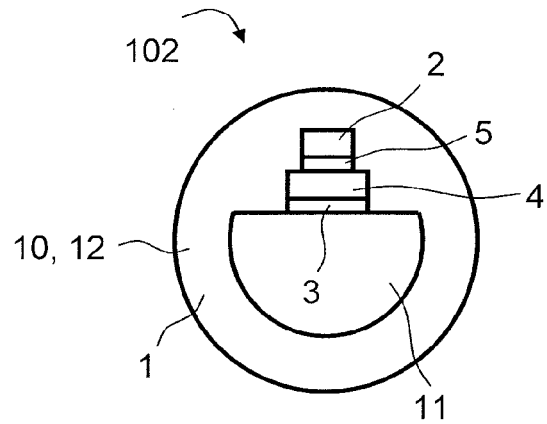
Figure 7C:
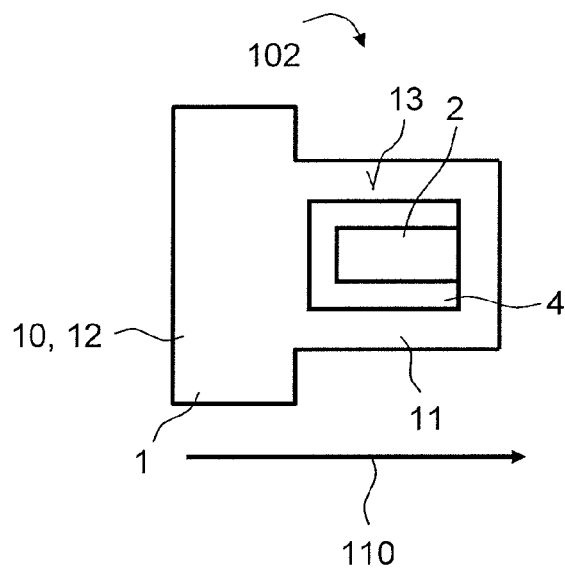

FIGS. 7A to 7C show a laser diode assembly 102 in accordance with a further exemplary embodiment in a schematic sectional illustration (FIG. 7A), in a plan view counter to the extension direction 110 (FIG. 7B) and in a plan view of the mounting area 13 (FIG. 7C). In comparison with the previous exemplary embodiments, in the case of the laser diode assembly 102, a heat-conducting element 4 is arranged between the laser diode chip 2 and the mounting part 11 of the housing 1. The heat-conducting element is embodied, in particular, as a so-called heat spreader and serves to expand the heat flow between the laser diode chip 2 and the mounting part 11 of the housing 1 in order to achieve the largest possible transition area during heat transfer into the housing 1.

In this case, as described above, the first solder layer 3, by means of which the heat-conducting element 4 is mounted on the mounting part 11 of the housing 1, can be embodied with a thickness of greater than or equal to 3 $\mu m$ and particularly preferably of greater than or equal to 5 $\mu m$. Furthermore, a second solder layer 5 is arranged between the heat-conducting element 4 and the laser diode chip 2, the laser diode chip 2 being mounted on the heat-conducting element 4 by means of said second solder layer. The second solder layer 5 can preferably likewise have a thickness of greater than or equal to 3 $\mu m$ and particularly preferably of greater than or equal to 5 $\mu m$. As an alternative thereto, it is also possible for only one of the two solder layers 3, 5 to have such a large thickness, for example, only the first solder layer 3.

The mounting part 11 can be formed by copper, as shown in the exemplary embodiment shown, or can also have a steel sheathing 12, as described in conjunction with FIG. 6 and indicated by the dashed line in FIG. 7A.

The laser diode chip 2 and the housing 1 have different coefficients of thermal expansion on account of the different materials. Usually, nitride-based semiconductor materials have a coefficient of thermal expansion of approximately 5.6×10-6 1/K and a thermal conductivity of approximately 100 W/mK, while copper has a coefficient of thermal expansion of approximately 16 . . . 18×$10^{-6}$ 1/K and a thermal conductivity of approximately 300 W/mK. Situated therebetween are a plurality of materials having likewise different coefficients of thermal expansion, thus, for example, a steel sheathing 12 of the mounting part 11, the solder layers 3 and 5 and the heat-conducting element 4. Steel has a coefficient of thermal expansion of approximately 6 . . . 12×$10^{-6}$ 1/K and a thermal conductivity of approximately 30 . . . 70 W/mK. The heat-conducting element 4 can comprise AlN, for example, or be composed thereof, AlN having a coefficient of thermal expansion of approximately 4.5 . . . 5.7×$10^{-6}$ 1/K and a thermal conductivity of approximately 80 . . . 200 W/mK. The coefficient of thermal expansion of an AlN heat-conducting element 4 is thus matched relatively well to the coefficient of thermal expansion of the laser diode chip 2. At the boundary transition between the AlN heat-conducting element 4 with respect to the housing 1, that is to say either with respect to copper or with respect to steel-sheathed copper, there is, however, a significant difference in the coefficients of thermal expansion.

Particularly preferably, therefore, as material for the heat-conducting element 4, instead of AlN, it is possible to use SiC, in particular 6H—SiC, which, although it has a coefficient of thermal expansion of approximately $4.4 \times 10^{-6}$ 1/K, also has a higher thermal conductivity of approximately 200 . . . 500 W/mK. As an alternative thereto, as heat-conducting element 4 it is also possible to use one of the following materials: CuW having a coefficient of thermal expansion of approximately $6 \ldots 8 \times 10^{-6}$ 1/K and a thermal conductivity of approximately 200 . . . 250 W/mK, BN having a coefficient of thermal expansion of approximately $2.5 \ldots 4 \times 10^{-6}$ 1/K and a thermal conductivity of approximately 600 W/mK, diamond, for example, diamond produced by means of CVD, which has an even higher thermal conductivity of approximately 1000 W/mK in conjunction with a coefficient of thermal expansion of $2.3 \times 10^{-6}$ 1/K. Although such materials for the heat-conducting element 4 are rather unfavorable with regard to a thermal strain, they can preferably be used in the laser diode assembly described here since the greater thermal strains brought about by these materials can be compensated for by the thick solder layers 3, 5 described here. The solder layers 3, 5 can comprise an indium-based soft solder, for example, in order to enable the best possible compensation of the thermally induced strains.

Figure 8:
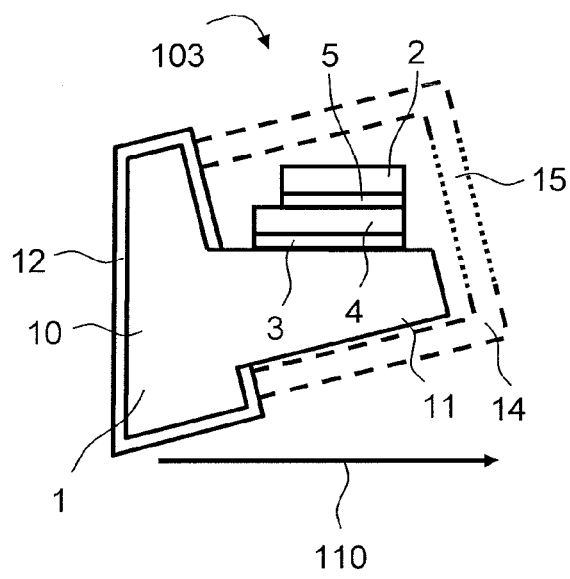

FIG. 8 shows a further exemplary embodiment of a laser diode assembly 103 which, purely by way of example, like the laser diode assembly 102 of the previous exemplary embodiment, has a heat-conducting element 4 between the laser diode chip 2 and the housing 1.

In comparison with the previous exemplary embodiments, the laser diode assembly 103 has a mounting part 11 having, perpendicular to the extension direction 110, a cross section that increases in size in the direction toward the housing part 10, that is to say counter to the extension direction 110. For this purpose, the mounting part 11 has, in the sectional plane shown, a wedge-shaped cross section which, near the housing part 1, is higher than in regions that are further away from the housing part 1. In other words, the thickness of the mounting part 11 increases toward the housing part 10.

Such a wedge-shaped cross section of the mounting part 11 can be advantageous, in particular, in order to achieve the highest possible thermal conductivity, and, as a result of the oblique arrangement of the laser diode chip 2 with respect to the housing cover 14 indicated and the window 15 thereof, can lead to only little or no shading at all through the window 15 of the housing cover 14. In order to ensure a mounting area for the laser diode assembly 103 which is oriented perpendicularly to the emission direction of the laser diode chip 2, the housing part 10 of the housing 1 likewise has a wedge-shaped cross section in the exemplary embodiment shown. As an alternative thereto, it is also possible for the connecting angle between the mounting part 11 and the housing part 10 to be not equal to 90° and to be adapted to the opening angle of the wedge that forms the mounting part 11. Furthermore, it is also possible to fit to the housing part 10 an auxiliary ring having a corresponding cross section, whereby the housing 1 can be mounted obliquely on a bearing area.

Figure 9:
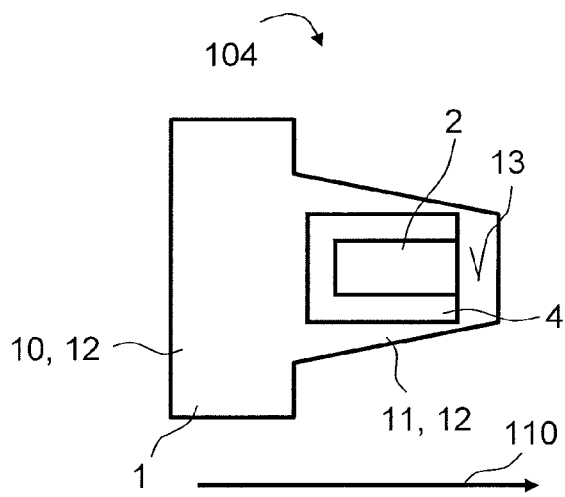

FIG. 9 shows, in a plan view of the mounting area 13, a further exemplary embodiment of a laser diode assembly 104 which, in addition or as an alternative to the wedge-shaped cross section of the mounting part 11 of the previous exemplary embodiment, has a wedge-shaped cross section of the mounting part 11 having an increasing width in the plane of the mounting area 13.

By virtue of the height and/or width of the mounting part 11 increasing toward the housing part 10, as shown in FIGS. 8 and 9, in addition to the embodiment of the housing 1 as a copper-based housing, an increase and optimization of the thermal conductivity of the housing 1 can be brought about.

The subsequent FIGS. 10 to 16 show exemplary embodiments of the laser diode chip 2 which can be mounted in a housing 1 of the above-described laser diode assemblies 100, 101, 102, 103, 104 by means of a partially shown solder layer. The layer construction of the laser diode chip 2 is not shown in the subsequent figures, for the sake of clarity.

The laser diode chip 2 of the following exemplary embodiments has, at least on a radiation coupling-out area 27, a crystalline protective layer 6 that is suitable and provided for protecting at least the radiation coupling-out area 27 against damaging environmental influences, for example, caused by the ambient air. Such damaging environmental influences in the ambient air can be, for example, oxygen, ozone, acid rain, sulfur and sulfur compounds and nitrogen oxides and hydrocarbons and other damaging chemicals. Such substances may possibly also penetrate undesirably into a housing 1 closed with a housing cover 14, since, on account of the different coefficients of thermal expansion between copper and steel, there is a particular technical challenge in connecting and welding a steel-based housing cover 14 to the housing part 10 sufficiently impermeably. In particular in high-volume manufacture of such housings 1, an increase in an unidentified proportion of components having a residual leakage can occur. Therefore, the crystalline protective layer 6 may be required for reliable use of the laser diode chip 2 in a housing 1 having high thermal conductivity described here, as additional protection of at least the radiation coupling-out area 27.

In particular, the crystalline protective layers 6 described below can be hermetically impermeable and thus have an impermeability that is high enough for the laser diode chip 2 to be sufficiently protected over its entire lifetime. The crystalline protective layers 6 in accordance with the following exemplary embodiments can be applied to the laser diode chip 2, for example, by means of an atomic layer deposition method, in particular by means of an atomic layer epitaxy method, or by means of a chemical vapor deposition method, in particular at temperatures of greater than or equal to 500° C. and preferably of greater than or equal to 600° C. Protective layers 6 applied by means of atomic layer deposition, in particular, advantageously form a crystal-defect-free, so-called "pin hole"-free structure having a good adhesion to surfaces, a high stability, a good overforming and a low-strain structure.

Furthermore, by virtue of the thick first solder layer 3 and, if appropriate, also by virtue of the thick second solder layer 5, an increased supply of solder can be present below the laser diode chip 2, which can have the effect that solder particles can migrate up to the laser diode chip 2 and in particular to the radiation coupling-out area 27 and can diffuse through a non-hermetically impermeable facet sheathing, which can lead to leakage currents via the radiation coupling-out area 27. Protection against diffusion of solder to the surface of the laser diode chip 2 can thus also be achieved by means of the crystalline protective layer 6. Furthermore, in the case of a dielectric material, the crystalline protective layer can bring about a significant increase in the breakdown field strength.

Figure 10:
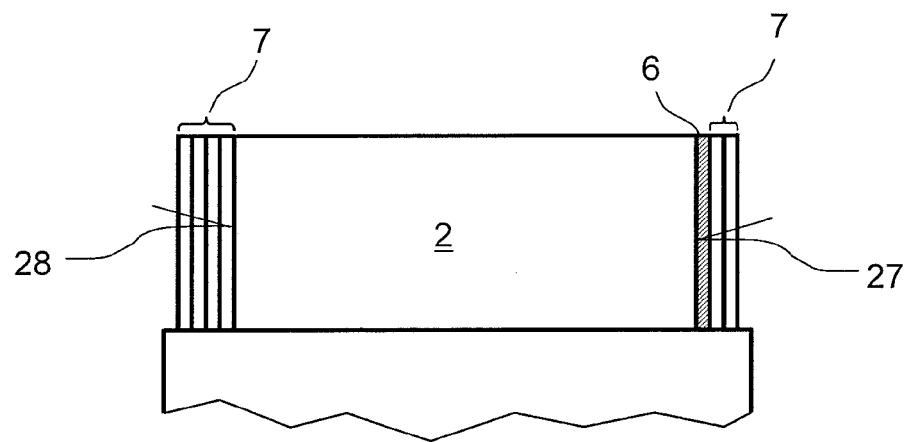
FIGS. 10 to 16 show schematic illustrations of parts of laser diode assemblies in accordance with further exemplary embodiments.

FIG. 10 shows an exemplary embodiment of a laser diode chip 2 in a sectional illustration, in which a crystalline protective layer 6 is applied directly on the radiation coupling-out area 27 of the laser diode chip 2. For this purpose, the crystalline protective layer 6 comprises a dielectric material, for example, one of the dielectric materials mentioned above in the general part. As an alternative thereto, it may also be possible for a dielectric passivation layer to be arranged between the crystalline protective layer 6 and the radiation coupling-out area 27, such that a semiconducting or conducting material, as described above in the general part, can also be used for the crystalline protective layer 6.

Furthermore, optical layers 7 in the form of layer stacks which are embodied as antireflective sheathing or reflective sheathing of the respective laser facet are applied on the radiation coupling-out area 27 and also on the rear side area 28 situated opposite the radiation coupling-out area 27. By way of example, the optical layer 7 applied on the radiation coupling-out area 27 can be embodied as an antireflective layer, while the optical layer 7 applied on the rear side area 28 is embodied as a reflective layer. The optical layers 7 can be applied by means of a method which is customary for the sheathing of laser diode facets and which produces typically amorphous or partially crystalline layers.

In the exemplary embodiment shown, the crystalline protective layer 6 is thus arranged between the optical layer 7 and the radiation coupling-out area 27. In order to protect the radiation coupling-out area 27, it can be sufficient if the crystalline protective layer 6 has a thickness of from a few nanometers to a few tens of nanometers, such that the crystalline protective layer 6 has no influence on the optical properties of the sheathing applied on the radiation coupling-out area 27, which are then substantially determined by the optical layer 7. As an alternative thereto, it is also possible for the crystalline protective layer 6 to be embodied as part of the optical layer 7 and to have an appropriately chosen thickness.

Figure 11:
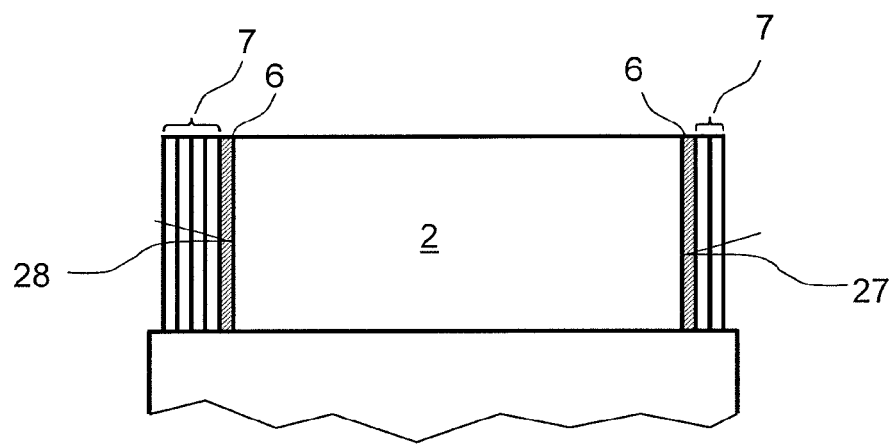

FIG. 11 shows an exemplary embodiment in which, in addition to the crystalline protective layer 6 on the radiation coupling-out area 27, on the rear side area 28, too, a crystalline protective layer 6 is arranged between the rear side area 28 and the optical layer 7. As a result, the rear side area 28 can also be protected both against damaging gases and against solder possibly migrating or diffusing to the rear side area 28.

Figure 12:
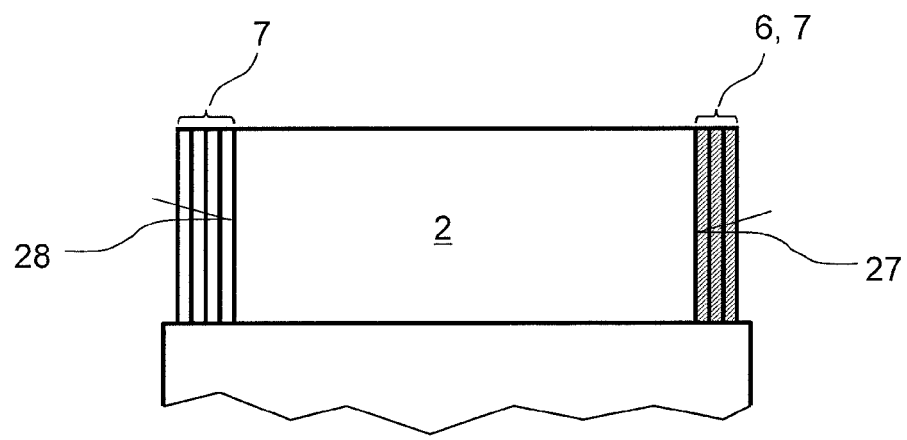

FIG. 12 shows a further exemplary embodiment, in which the optical layer 7 on the radiation coupling-out area 27 is formed by the crystalline protective layer 6. For this purpose, the crystalline protective layer 6 has one and preferably a plurality of layers composed of different materials having the desired antireflective or reflective properties.

Figure 13:
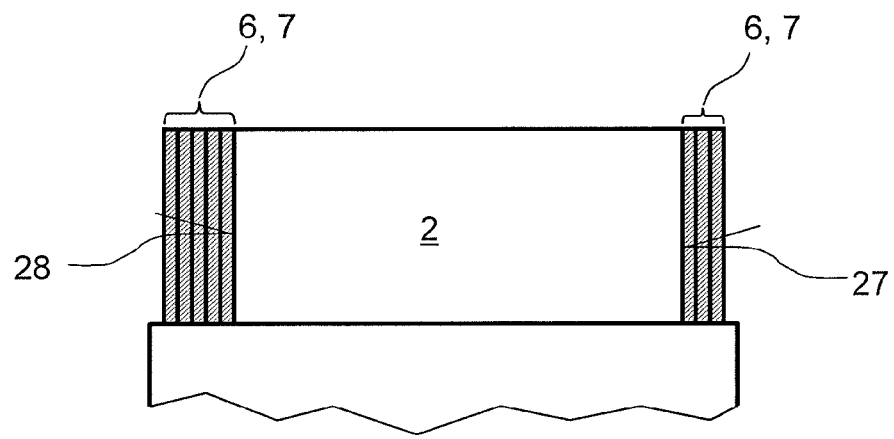

FIG. 13 shows a further exemplary embodiment, in which the optical layer 7 on the rear side area 28 is also formed by a crystalline protective layer 6. In this case too, the crystalline protective layers 6 can each have one and preferably a plurality of crystalline layers composed of different materials which lead to the desired antireflective or reflective property.

Figure 14:
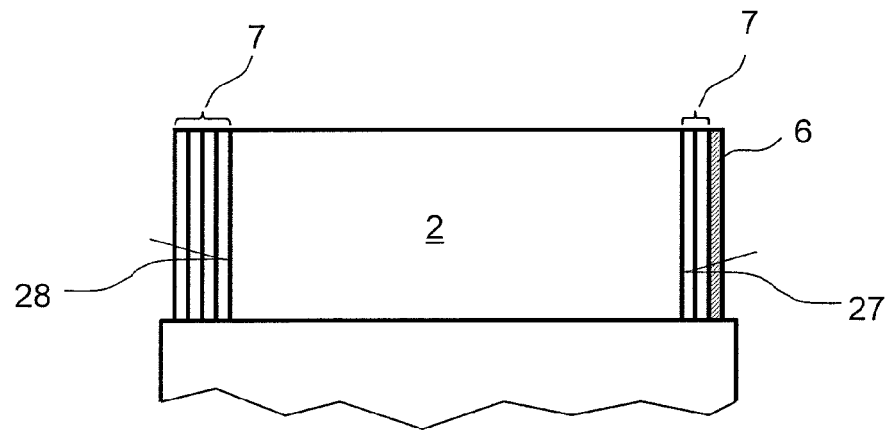

FIG. 14 shows a further exemplary embodiment, in which, in comparison with the exemplary embodiment in FIG. 10, on the radiation coupling-out area 27 the crystalline protective layer 6 is applied on the optical layer 7, such that the optical layer 7 is arranged between the crystalline protective layer 6 and the radiation coupling-out area 27 and is thus covered by the crystalline protective layer 6. As a result, firstly the optical layer 7 in addition to the radiation coupling-out area 27 can be protected by the crystalline protective layer 6. Furthermore, it is also possible, as an alternative to a dielectric material, also to use a semiconducting material or a conducting material, for example, one of the materials mentioned above in the general part, for the crystalline protective layer 6.

Figure 15:
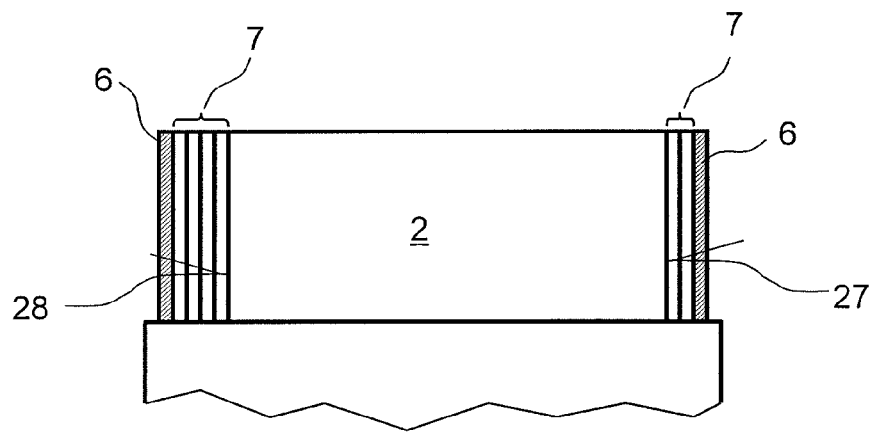

In the exemplary embodiment in FIG. 15, a crystalline protective layer 6 is also applied on the optical layer 7 on the rear side area 28, which protective layer can protect the rear side area 28 and also the optical layer 7 on the rear side area 28.

Figure 16:
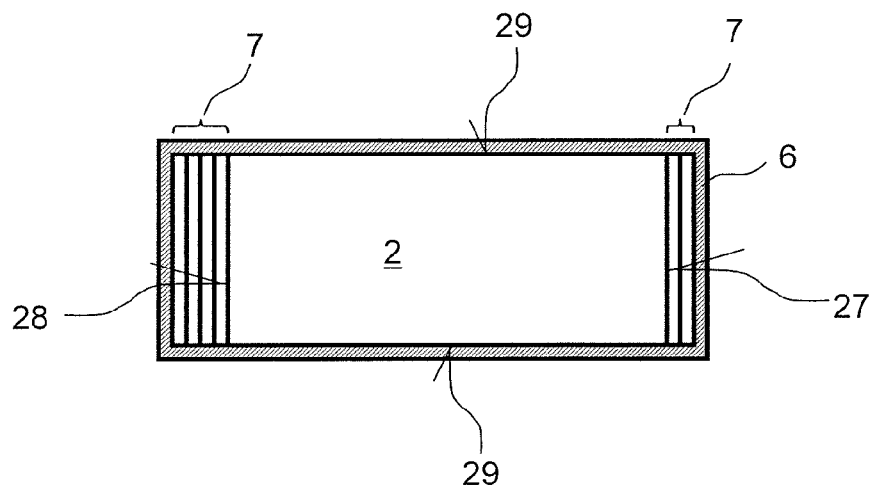

FIG. 16 shows a further exemplary embodiment, which shows the laser diode chip 2 in a plan view from above and in which, in addition to the crystalline protective layer 6 on the radiation coupling-out area 27 and the rear side area 28, a crystalline protective layer 6 is applied on the side areas 29 that connect the rear side area 28 and the radiation coupling-out area 27 to one another. As a result, protection of the laser diode chip 2 and in particular the semiconductor layers thereof and the interfaces between the semiconductor layers can be achieved on all sides, since all side areas of the laser diode chip 2 are covered with the crystalline protective layer 6. In this case, as shown in FIG. 16, the crystalline protective layer 6 can be applied over the optical layers 7. As an alternative thereto, it is also possible to apply the crystalline protective layer 6 directly on the radiation coupling-out area and/or the rear side area 28.

The features described and shown in the Figures and exemplary embodiments can be combined with one another in accordance with further exemplary embodiments, even if such combinations are not explicitly shown in the Figures. In particular, the different housing forms, the use of a heat-conducting element 4 and also the arrangement of one or more protective layers 6 on the laser diode chip 2 can be combined with one another. Furthermore, the exemplary embodiments shown in the figures can also have alternative or additional features in accordance with the embodiments in the general part.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. A laser diode assembly comprising:
   a housing having a housing part and a mounting part that is connected to the housing part and that extends away from the housing part along an extension direction;
   a laser diode chip disposed on the mounting part, the laser diode chip having semiconductor layers on a substrate, wherein the semiconductor layers include an active layer for emitting light, wherein the laser diode chip is based on a nitride compound semiconductor material;
   a first solder layer arranged between the laser diode chip and the mounting part, the first solder layer having a thickness of greater than or equal to 3 µm; and
   a crystalline protective layer located on a radiation coupling out area of the laser diode chip.

2. The laser diode assembly according to claim 1, wherein the housing part and the mounting part have a main body composed of copper, and wherein the housing part is steel coated.

3. The laser diode assembly according to claim 1, wherein the active layer has an area of greater than or equal to 10,000 µm.

4. The laser diode assembly according to claim 1, wherein the thickness of the first solder layer is greater than or equal to 5 µm.

5. The laser diode assembly according to claim 1, wherein a heat conducting element is arranged between the laser diode chip and the mounting part.

6. The laser diode assembly according to claim 5, wherein the heat conducting element is fixed on the mounting part by the first solder layer and the laser diode chip is fixed on the heat conducting element by a second solder layer.

7. The laser diode assembly according to claim 6, wherein the second solder layer has a thickness of greater than or equal to 3 µm.

8. The laser diode assembly according to claim 5, wherein the heat conducting element comprises SiC, BN, CuW or diamond.

9. The laser diode assembly according to claim 1, further comprising a housing cover applied on the housing part and welded to the housing part, wherein the mounting part projects into the housing cover from the housing part along the extension direction.

10. The laser diode assembly according to claim 9, wherein the mounting part projects as far as the housing cover at least at one side perpendicularly to the extension direction.

11. The laser diode assembly according to claim 9, wherein the housing part and the housing cover have a circular cross section in a plane perpendicular to the extension direction and the mounting part has a cross section occupying more than a semicircular area in a plane perpendicular to the extension direction.

12. The laser diode assembly according to claim 1, wherein the mounting part has a cross section that increases in size in a direction of the housing part.

13. The laser diode assembly according to claim 12, wherein the mounting part has a wedge shaped cross section in a plane parallel to the extension direction.

14. The laser diode assembly according to claim 13, wherein the housing part has a wedge shaped cross section in a plane parallel to the extension direction.

15. A laser diode assembly comprising:
a housing having a housing part and a mounting part that is connected to the housing part and that extends away from the housing part along an extension direction;
a laser diode chip disposed on the mounting part, the laser diode chip having semiconductor layers on a substrate, the semiconductor layers including an active layer for emitting light, wherein the laser diode chip is based on a nitride compound semiconductor material and has a non-polar or semi-polar crystal structure; and
a first solder layer arranged between the laser diode chip and the mounting part, the first solder layer having a thickness of greater than or equal to 3 μm, wherein, during operation, the laser diode chip has a higher power loss in layers on that side of the active layer which faces away from the substrate and a lower power loss in the active layer, than a laser diode chip that is based on a nitride compound semiconductor material and has a polar crystal structure.

16. A laser diode assembly comprising:
a housing having a housing part and a mounting part that is connected to the housing part and that extends away from the housing part along an extension direction;
a laser diode chip disposed on the mounting part, the laser diode chip having semiconductor layers on a substrate, wherein the semiconductor layers include an active layer for emitting light, wherein the laser diode chip is based on a nitride compound semiconductor material; and
a first solder layer arranged between the laser diode chip and the mounting part, wherein the housing part and the mounting part have a main body composed of copper, and wherein the housing part is steel coated.

* * * * *